(12) United States Patent
Zinn

(10) Patent No.: US 9,212,046 B2
(45) Date of Patent: Dec. 15, 2015

(54) MEMS MICROPHONE WITH MEMBRANE ANTENNAS

(71) Applicant: Robert Bosch GmbH, Stuttgart (DE)

(72) Inventor: John W. Zinn, Canonsburg, PA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/513,254

(22) Filed: Oct. 14, 2014

(65) Prior Publication Data

US 2015/0102435 A1 Apr. 16, 2015

Related U.S. Application Data

(60) Provisional application No. 61/890,957, filed on Oct. 15, 2013.

(51) Int. Cl.
| | |
|---|---|
| *H01L 29/84* | (2006.01) |
| *B81B 3/00* | (2006.01) |
| *B81B 7/00* | (2006.01) |
| *H04R 19/00* | (2006.01) |
| *H04R 19/04* | (2006.01) |
| *H04R 31/00* | (2006.01) |

(52) U.S. Cl.
CPC .............. *B81B 3/0021* (2013.01); *B81B 7/0058* (2013.01); *H04R 19/005* (2013.01); *H04R 19/04* (2013.01); *B81B 2201/0257* (2013.01); *H04R 31/00* (2013.01)

(58) Field of Classification Search
None
See application file for complete search history.

(56) References Cited

U.S. PATENT DOCUMENTS

2015/0001647 A1 * 1/2015 Dehe et al. .................... 257/416

* cited by examiner

*Primary Examiner* — Yasser A Abdelaziez
(74) *Attorney, Agent, or Firm* — Michael Best & Friedrich LLP

(57) ABSTRACT

A MEMS microphone. The microphone includes a backplate, a membrane, and a plurality of antennas. The backplate has a plurality of acoustic apertures. The membrane is parallel to the backplate and is positioned a distance from the backplate. The plurality of antennas are connected to the membrane and extend toward the backplate. In addition, the plurality of antennas are positioned entirely within spaces defined by the plurality of acoustic apertures.

19 Claims, 5 Drawing Sheets

MEMS MICROPHONE WITH MEMBRANE ANTENNAS

RELATED APPLICATION

The present patent application claims the benefit of prior filed U.S. Provisional Patent Application No. 61/890,957, filed on Oct. 15, 2013, the entire content of which is hereby incorporated by reference.

BACKGROUND

The present invention relates to MEMS microphones. Specifically, the invention relates to antennas positioned on a membrane of a MEMS microphone.

MEMS microphones have a backplate (i.e., a perforated counter electrode) and a membrane. A capacitive charge is created between the backplate and the membrane that varies as the membrane vibrates in reaction to an acoustic disturbance (i.e., a change in air pressure, e.g., due to a sound). FIG. 1 shows a structure of a prior art MEMS microphone including a backplate 100 and a membrane 105. During microphone operation, a high bias voltage (e.g., 1 to 40 V) is typically applied between the membrane 105 and the backplate 100. To maintain this charge, it necessary to limit the distance between the membrane 105 and the backplate 100 to a relatively small gap. The limitation on this distance also limits the sensitivity of the membrane 105, and, thus, the microphone.

SUMMARY

In one embodiment, the invention provides A MEMS microphone. The microphone includes a backplate, a membrane, and a plurality of antennas. The backplate has a plurality of acoustic apertures. The membrane is parallel to the backplate and is positioned a distance from the backplate. The plurality of antennas are connected to the membrane and extend toward the backplate. In addition, the plurality of antennas are positioned entirely within spaces defined by the plurality of acoustic apertures.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Figure 1:
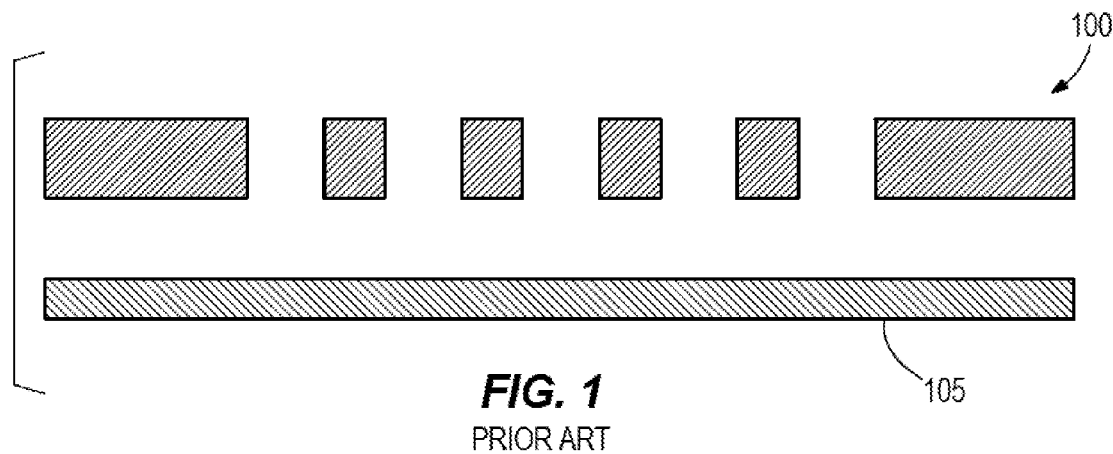
FIG. 1 is a cut-away view of a backplate and membrane of a prior art MEMS microphone.
Figure 2:
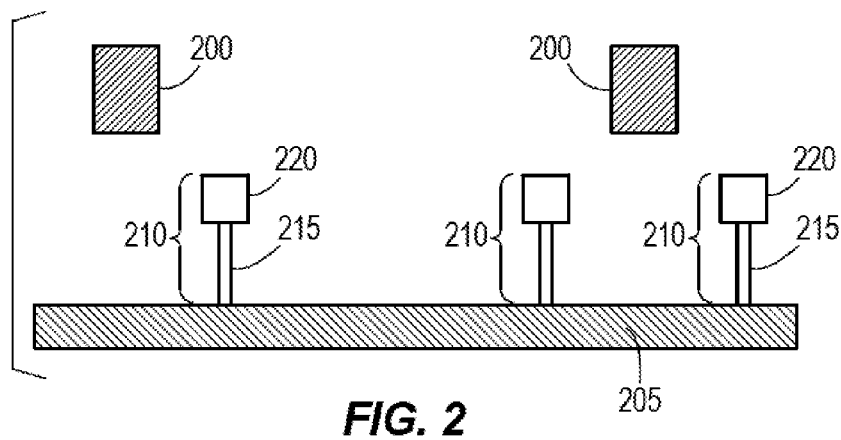
FIG. 2 is side/cut-away view of a MEMS microphone having membrane antennas.

FIG. 2 shows a structure of an improved MEMS microphone including a backplate (i.e., a counter electrode plate) 200 having a plurality of acoustic apertures 202, a membrane 205, and a plurality of antennas 210. The plurality of antennas 210 are positioned within spaces defined by the plurality of acoustic apertures 202 such that when the membrane 205 deflects due to acoustic pressure, the plurality of antennas 210 move into the acoustic apertures 202 and do not come into contact with the backplate 200. During microphone operation, a high bias voltage (e.g., 1 to 40 V) is applied between the antennas 210 and the backplate 200. The membrane 205 can be an electrode (i.e., electrically coupled to the antennas 210) or can be insulated. In the structure shown the antennas 210 include a support structure 215 (e.g., a pole) which is connected to the membrane 205 and an extended electrode 220 connected to an end of the support structure 215 opposite the end of the support structure 215 connected to the membrane 205.

Figure 3:
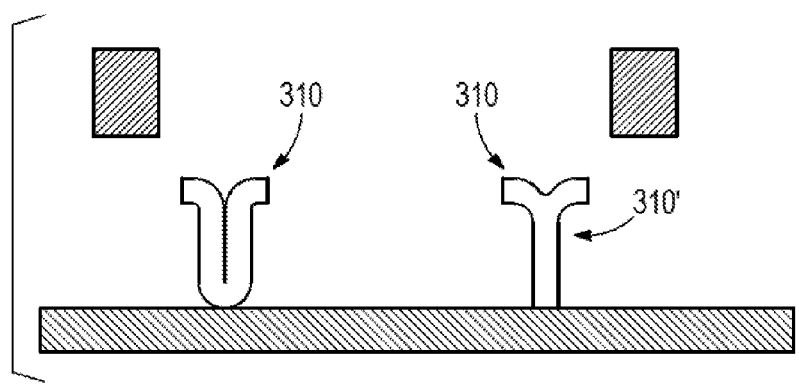
FIG. 3 is side/cut-away view of a MEMS microphone having membrane antennas showing a construction of the antennas.

The antennas 210 can be the same material as the membrane 205 or can be one or more different materials. The antennas 210 can be separate elements that are attached to the membrane 205 or, alternatively, the antennas 210 can be formed by etching layers of material. For example, as shown in FIG. 3, the antennas 310 are formed as a layer of deposited material which is directly attached to the membrane 205. Such a deposited layer, which forms folded antennas 310, can then be filled using an additional deposited material as shown by antenna 310'.

Figure 4A:
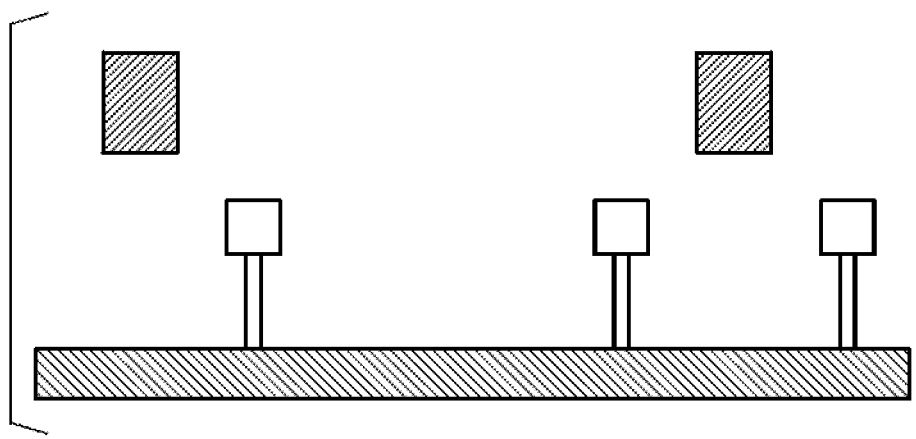
FIGS. 4A and 4B show the relative position of the antennas versus the backplate as a result of an acoustic disturbance.
Figure 4B:
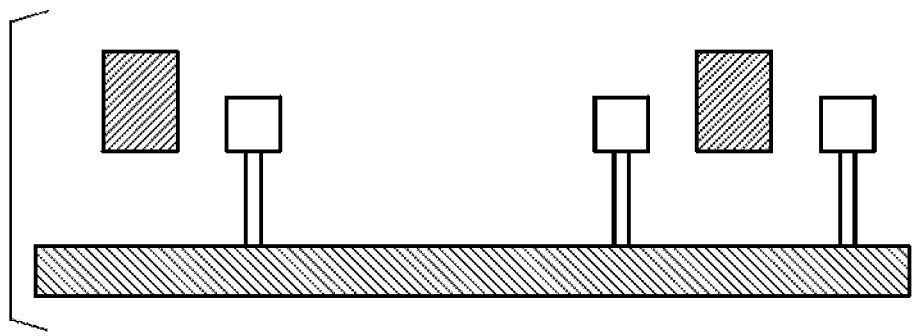

FIGS. 4A and 4B show the relationship of the backplate 200 to the antennas 210 as the membrane 205 moves in response to an acoustic disturbance. The position of the backplate 200 relative to the antennas 210 moves between position shown in FIG. 4A and the position shown in FIG. 4B. Thus, the distance between the backplate 200 and the antennas 210 varies, which varies the capacitance of the microphone. The change in capacitance is detected and converted to a signal representative of the acoustic disturbance that moved the membrane 205. The relative changes shown in FIGS. 4A and 4B are representative, the actual change varies depending on the stiffness of the membrane 205 and the magnitude of the acoustic disturbance.

Figure 5:
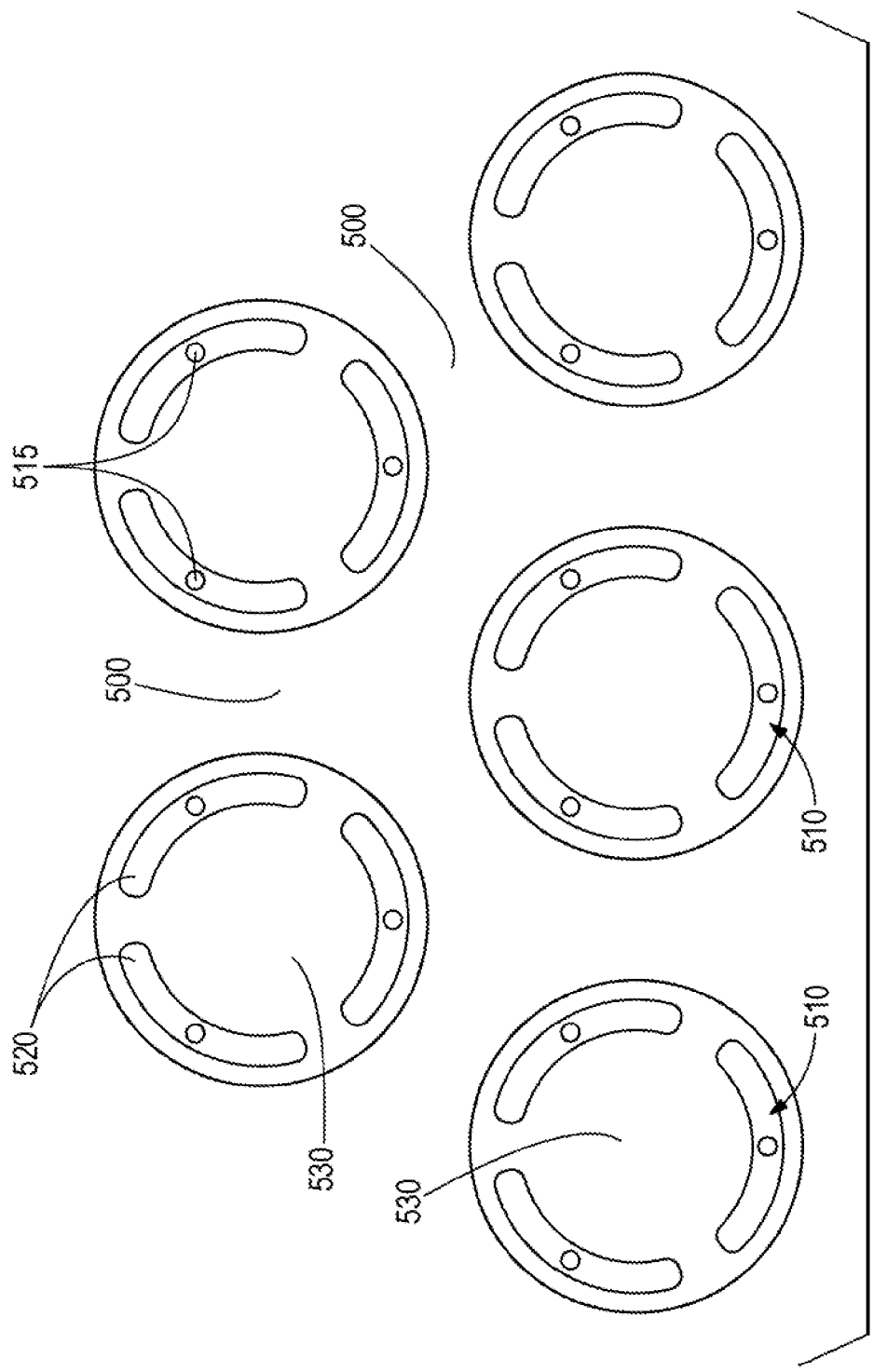
FIG. 5 is a partial top view of a MEMS microphone having circular acoustic apertures.

The backplate 200 includes a large number of acoustic apertures to allow air to flow to membrane 205 in order to detect an acoustic disturbance. FIG. 5 shows a sample structure of antennas 510 for a backplate 500 having circular acoustic apertures 530. In this construction the extended electrodes 520 are arc shaped, and three antennas 510 are positioned equally within the space of the aperture 530. Again, the antenna 510 can be formed using different techniques such that the support structure 515 and the extended electrodes 520 can be a single piece or multiple pieces.

Figure 7:
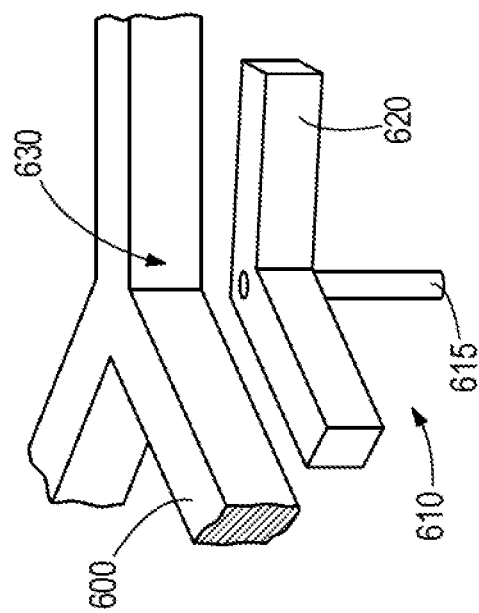
FIG. 7 is a plan view of an aperture and antenna of the MEMS microphone of FIG. 6.
Figure 6:
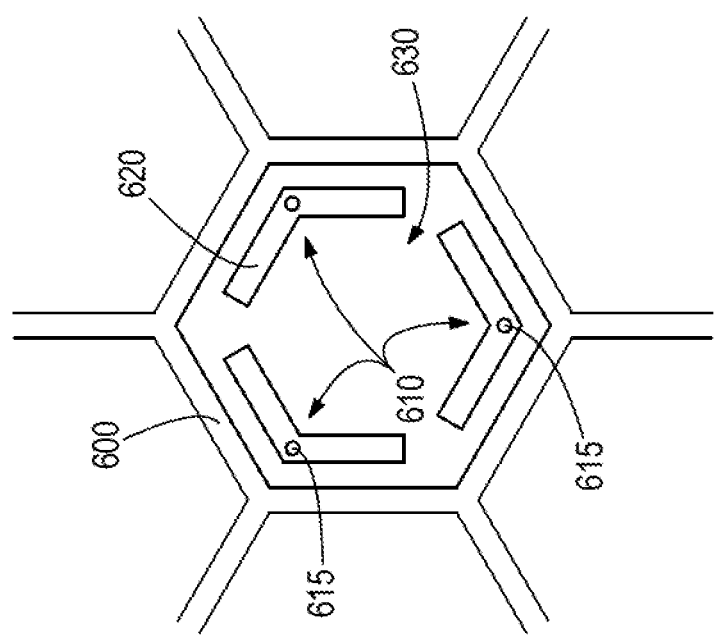
FIG. 6 is a partial top view of a MEMS microphone having hexangular acoustic apertures.

FIG. 6 shows an alternative construction of a backplate 600 and antenna 610 structure. In the construction shown, the acoustic apertures 630 of the backplate 600 have a hexagonal shape, and the extended electrodes 620 of the antennas 610 have a chevron shape. FIG. 7 provides a plan view of the backplate 600 and antenna 610 of FIG. 6.

Figure 8:
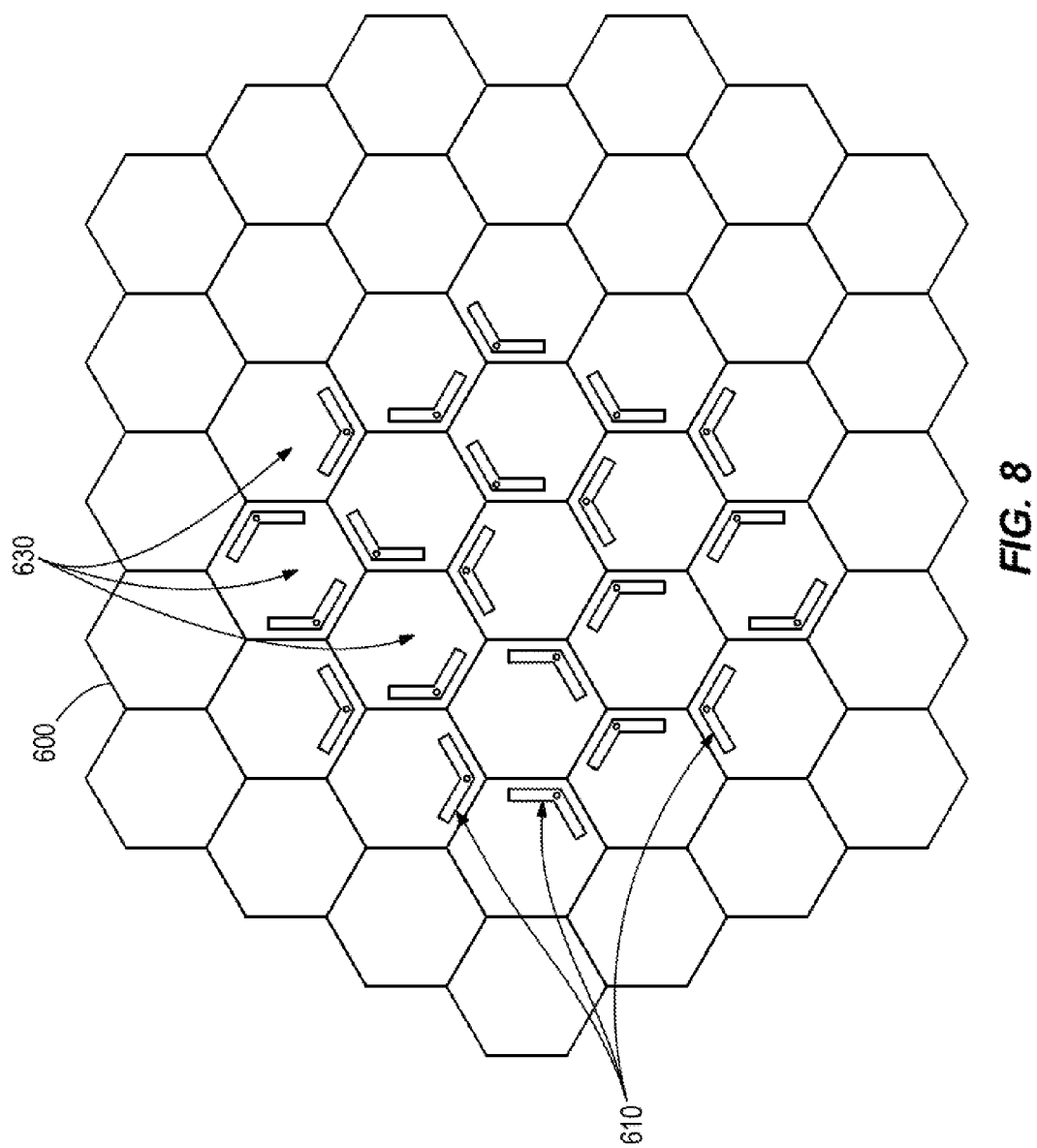
FIG. 8 is a partial top view of a MEMS microphone having hexangular acoustic apertures.

FIG. 8 shows an expanded view of a hexagonal backplate 600 showing multiple acoustic apertures 630 and antennas 610. In the construction shown, each aperture 630 has one or two antennas 610 such that each "beam" of the backplate 600 has only one adjacent antenna 610. In other constructions, the quantity of antenna 610 in the apertures 630 varies. For example, apertures 630 nearer the outer edge of the backplate 600 can have fewer or no antennas 610 while apertures 630 nearer the center of the backplate 600 can have multiple antennas 610 (e.g., three chevron shaped antenna for a hexagonal aperture).

By using antennas, the backplate and membrane are positioned a greater distance apart (e.g., >4 microns) which reduces the acoustic self-noise of the microphone. In addition, the antennas allow for improved flow of air under the antennas and through the apertures which also reduces the acoustic noise and improves the microphone performance. This structure can improves a signal-to-noise ratio (SNR) of the microphone by as much as 2 dB. At the same time, the distance between the antenna electrode and the backplate is small (e.g., <1 micron), which improves the sensitivity of the microphone. Under a pressure disturbance, which would cause a traditional microphone membrane to snap-in to the backplate, a microphone with antenna structures demonstrates less susceptibility to snap-in because the force vector between the electrodes is transformed from being aligned with the direction of membrane motion to being orthogonal to the direction of membrane motion as the antennas move into the backplate apertures.

Thus, the invention provides, among other things, a MEMS microphone incorporating antenna electrodes attached to the membrane to achieve a reduction of self noise and a high level of sensitivity.

Thus, the invention provides, among other things, an improved MEMS microphone. Various features and advantages of the invention are set forth in the following claims.

What is claimed is:

1. A MEMS microphone, the microphone comprising:
    a backplate having a plurality of acoustic apertures;
    a membrane parallel to the backplate and positioned a distance from the backplate; and
    a plurality of antennas connected to the membrane and extending toward the backplate;
    wherein the plurality of antennas are positioned entirely within spaces defined by the plurality of acoustic apertures.

2. The MEMS microphone of claim 1, wherein a plurality of antennas are positioned within the spaces defined by one or more of the plurality of acoustic apertures.

3. The MEMS microphone of claim 1, wherein when overloaded, the plurality of antennas do not contact the backplate.

4. The MEMS microphone of claim 1, wherein a bias voltage is applied between the plurality of antennas and the backplate.

5. The MEMS microphone of claim 1, wherein the plurality of acoustic apertures are hexagonally shaped and the plurality of antennas are V-shaped and positioned such that a corner of each of the plurality of antennas is positioned adjacent a corner of one of the plurality of openings.

6. The MEMS microphone of claim 1, wherein two of the plurality of antennas are positioned within the spaces defined by one or more of the plurality of acoustic apertures.

7. The MEMS microphone of claim 1, wherein the plurality of acoustic apertures are circular shaped and the plurality of antennas are arc-shaped.

8. The MEMS microphone of claim 1, wherein two or more of the plurality of antennas are positioned within the spaces defined by one or more of the plurality of acoustic apertures.

9. The MEMS microphone of claim 1, wherein each of the plurality of antennas include a support structure and an extended electrode, a first end of the support structure connected to the membrane and a second end opposite the first end of the support structure connected to the extended electrode.

10. The MEMS microphone of claim 1, wherein the plurality of antennas are formed of the same material as the membrane.

11. The MEMS microphone of claim 1, wherein the plurality of antennas formed as part of the membrane by etching.

12. The MEMS microphone of claim 1, wherein the plurality of antennas are formed using two or more materials.

13. The MEMS microphone of claim 1, wherein the plurality of antennas are formed using one or more materials that are different than the material used to form the membrane.

14. The MEMS microphone of claim 1, wherein the plurality of antennas do not contact the backplate during an acoustic overload condition.

15. The MEMS microphone of claim 1, wherein the plurality of antennas are formed as a layer of deposited material directly attached to the membrane.

16. The MEMS microphone of claim 1, wherein the plurality of antennas are formed as folded antennas, and are filled using additional deposited material.

17. The MEMS microphone of claim 1, wherein the backplate and membrane are positioned greater than four microns apart.

18. The MEMS microphone of claim 1, wherein the plurality of antennas allow for greater airflow between the backplate and membrane, reducing a signal-to-noise ratio over existing MEMS microphones by as much as 2 dB.

19. The MEMS microphone of claim 1, wherein the distance between the backplate and the plurality of antennas is less than one micron increasing sensitivity of the microphone.

* * * * *